(12) United States Patent
Wang et al.

(10) Patent No.: US 6,556,082 B1
(45) Date of Patent: Apr. 29, 2003

(54) TEMPERATURE COMPENSATED CURRENT MIRROR

(75) Inventors: Nanlei Larry Wang, Palo Alto, CA (US); Sarah Xu, San Jose, CA (US); Shuo-Yuan Hsiao, Milpitas, CA (US)

(73) Assignee: EiC Corporation, Fremont, CA (US)

( * ) Notice: Subject to any disclaimer, the term of this patent is extended or adjusted under 35 U.S.C. 154(b) by 0 days.

(21) Appl. No.: 09/976,445

(22) Filed: Oct. 12, 2001

(51) Int. Cl.[7] ................................................ H03F 3/04
(52) U.S. Cl. ........................ 330/288; 330/289; 330/296
(58) Field of Search ................................. 330/288, 289, 330/296, 256, 257

(56) References Cited

U.S. PATENT DOCUMENTS 6,300,837 B1 * 10/2001 Sowlati et al. .............. 380/296
6,424,225 B1 * 7/2002 Choi et al. .................. 330/289

* cited by examiner

*Primary Examiner*—Henry Choe
(74) *Attorney, Agent, or Firm*—Townsend and Townsend and Crew LLP; Henry K. Woodward

(57) ABSTRACT

A temperature compensating circuit for use with a current mirror circuit for maintaining a reference current value during temperature variations includes a compensating transistor connected in parallel with a reference current transistor and bias circuitry for biasing the compensating transistor whereby current flows from the reference node to ground through the compensating transistor to remove excess current from the reference transistor when temperature increases. A diode can be included in the bias circuitry for limiting bias current flow when the reference voltage drops below the voltage drop of the diode. An on/off switch circuit can be provided in parallel with the reference current transistor to further reduce reference current in specific applications.

9 Claims, 2 Drawing Sheets

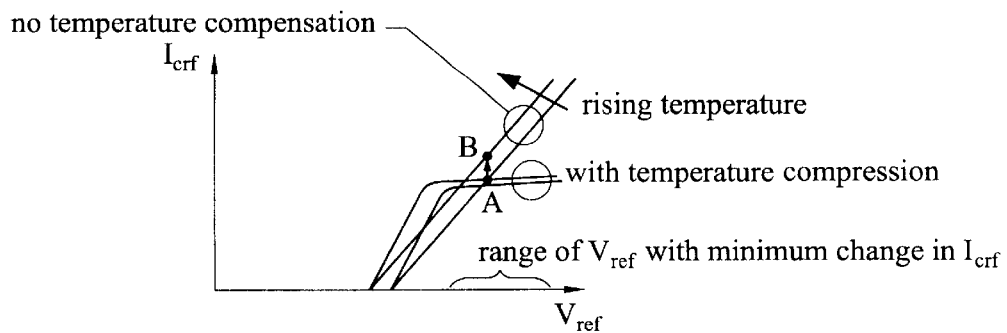
FIG. 4
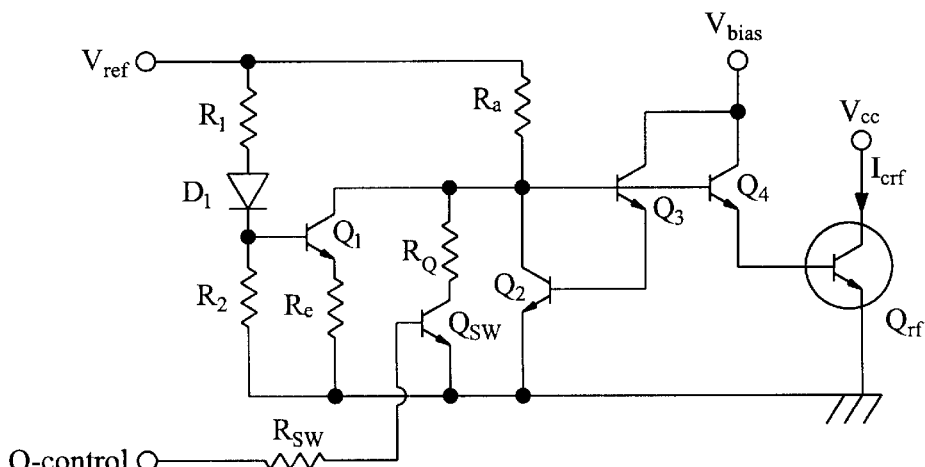
FIG. 5
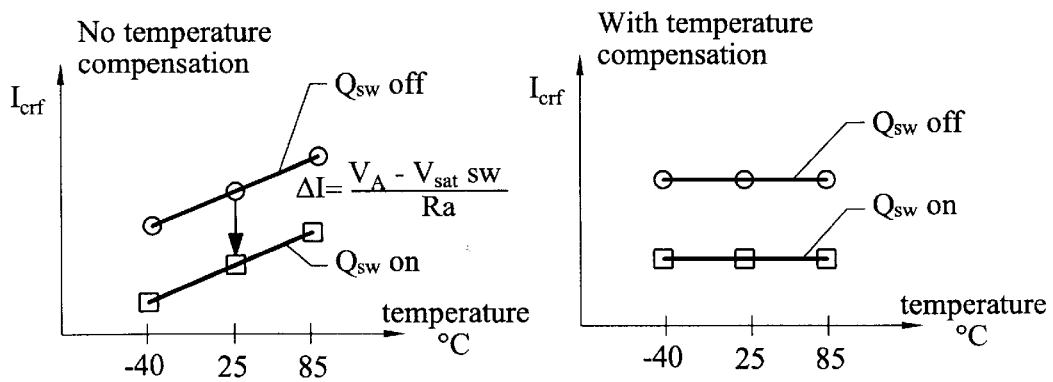
FIG. 6A
FIG. 6B

TEMPERATURE COMPENSATED CURRENT MIRROR

BACKGROUND OF THE INVENTION

This invention relates generally to electrical circuits, and more particularly, the invention relates to a current mirror circuit with temperature compensation.

The current mirror is often used in bipolar circuits such as low voltage bipolar amplifier circuits. A problem in low voltage applications stems from variations in base-emitter voltage, $V_{be}$, with temperature, which can adversely affect a reference current and a mirrored current. In many applications, including power amplifiers, current mirror circuitry is used to set up an operating current through the amplifier. With a low operating voltage using a three cell nickel battery or lithium ion battery, it becomes difficult to maintain a constant current over a temperature range. Unfortunately, changing the operating current over temperature will adversely affect circuit performance.

For example, FIG. 1 shows a prior art current mirror circuit used to set the operating current for a rf power amplifier transistor, $Q_{rf}$. A reference current, $I_{ref}$, flowing from a reference voltage, $V_{ref}$, to circuit ground through resistor Ra and transistor $Q_2$ is mirrored (proportionately to transistor sizes) as current $I_{crf}$ through rf power transistor $Q_{rf}$ -between voltage $V_{cc}$ and ground. Transistors $Q_3$, $Q_4$ connect a bias voltage, $V_{bias}$, to the respective base regions of transistors $Q_2$, $Q_{rf}$ due to the same bias voltage, $V_A$, being applied to transistors $Q_3$, $Q_4$. As temperature rises, the current through $Q_{rf}$ increases as $V_{be}$ is reduced at about $-2$ mV/° C. for a silicon bipolar transistor or $-1$ mV/° C. for a gallium arsenide heterojunction bipolar transistor, GaAs HBT. When this circuit is used in a CDMA handset power amplifier, the increased bias current of $Q_{rf}$ at high temperature is unfavorable for "talk time".

The present invention is directed to compensating for temperature induced variations in a current mirror circuit, such as shown in FIG. 1, for example.

BRIEF SUMMARY OF THE INVENTION

In accordance with the invention, in a current mirror circuit having a reference node and a reference current transistor connected to the reference node, a temperature compensating circuit for maintaining the reference current value during temperature variations includes a compensating transistor connected between the reference node and circuit ground and parallel with the reference current transistor. Bias circuitry is provided for biasing the compensating transistor whereby current flows from the reference node to ground through the compensating transistor in order to remove excess current when temperature increases.

In a low voltage bipolar transistor amplifier circuit embodiment, a power bipolar transistor is connected between a supply voltage and circuit ground, and a current mirror circuit including a reference current transistor is serially connected with a first resistor between a reference voltage and circuit ground. A pair of bipolar bias voltage transistors are connected respectively between a bias voltage and a base of the reference current transistor and between the bias voltage and a base of the power bipolar transistor, the bases of the pair of bipolar bias voltage transistors being connected to the common terminal of the reference current transistor and the first resistor. The temperature compensating circuit including the compensating transistor is then connected between the reference node and circuit ground in parallel with the reference current transistor with bias circuitry biasing the compensating transistor whereby current flows from the reference node to ground through the compensating transistor to remove excess current from the node when temperature increases.

In another embodiment of the invention, the bias circuitry for the compensating transistor includes a diode for limiting bias circuitry current flow when the reference voltage drops below the base-emitter voltage of the compensating transistor.

In another embodiment, a switch transistor can be connected in parallel with the reference current transistor to reduce the reference current transistor when the switch transistor is conducting.

The invention and objects and features thereof will be more readily apparent from the following detailed description and dependent claims when taken with the drawings.

BRIEF DESCRIPTION OF THE DRAWINGS

FIG. 4 is a graph illustrating compensated and uncompensated power transistor current in the circuits of FIGS. 1 and 2.

FIG. 5 is a schematic of another embodiment of the temperature compensated current mirror and low voltage power amplifier with a reference current adjustment transistor.

FIGS. 6A and 6B are graphs illustrating power transistor current versus temperature with low temperature compensation and with temperature compensation, respectively.

Like elements in the figures have the same reference numerals.

DESCRIPTION OF THE SPECIFIC EMBODIMENTS

Figure 1:
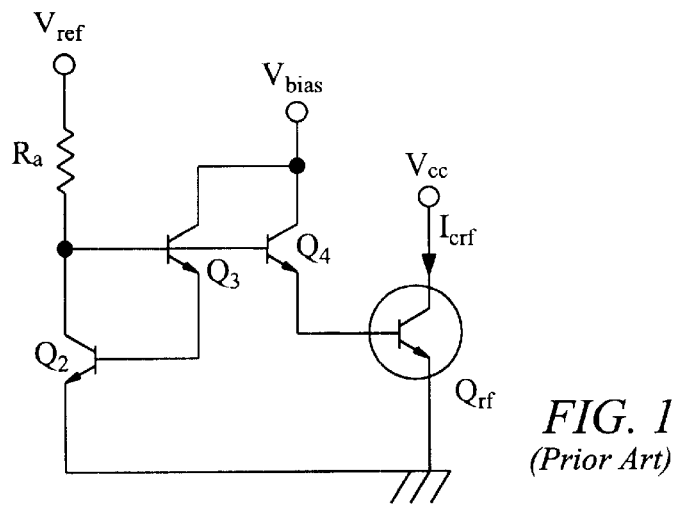
FIG. 1 is a schematic of a low voltage bipolar power amplifier with current mirror in accordance with the prior art.

FIG. 1 is a schematic of a low voltage bipolar power amplifier with a standard current mirror circuit for setting up operation current in accordance with the prior art. Power transistor $Q_{rf}$ is connected between a supply voltage $V_{cc}$ and a circuit ground with operating current $I_{crf}$ flowing through the power transistor. Current $L_{crf}$ is a mirror (proportional to transistor parameters) of a reference current $I_{ref}$ flowing through transistor $Q_2$ serially connected with resistor Ra between a reference voltage, $V_{ref}$, and circuit ground. Bias transistors $Q_3$, $Q_4$ receive a base voltage from the common terminal $V_A$ of resistor Ra and transistor $Q_2$ and provide a bias voltage $V_{be}$ to the base of transistor $Q_3$ and the base of transistor $Q_4$, respectively.

As noted above, as temperature rises, the current through transistor $Q_{rf}$ increases as $V_{be}$ is reduced at about $-2$ mV/° C. for a silicon bipolar transistor or $-1$ mV/° C. for a GaAs heterojunction bipolar transistor. When the circuit of FIG. 1 is used in a CDMA handset power amplifier, the increased bias current of $Q_{rf}$ at high temperature is unfavorable for the "talk time".

Figure 2:
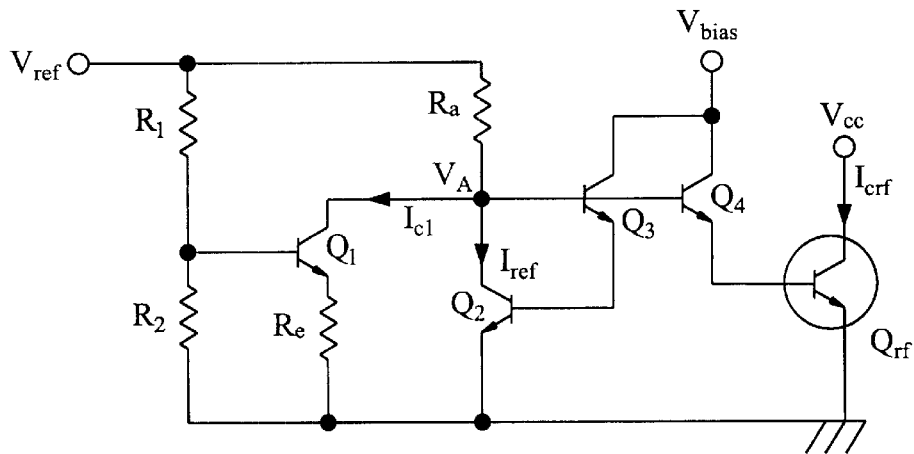
FIG. 2 is a schematic of a low voltage bipolar power transistor with current mirror in accordance with an embodiment of the invention.

In accordance with the invention, a temperature compensation circuit is provided to minimize the change of bias current versus temperature as illustrated in one embodiment of FIG. 2. Like elements in the circuitry of FIG. 1 and FIG. 2 have the same reference numerals. In FIG. 2 the compensation circuit includes a transistor $Q_1$ serially connected with resistor $R_e$ and in parallel with transistor $Q_2$ to remove excess current at node $V_A$ as temperature rises. The reference current $I_{ref}$ through transistor $Q_2$ must be kept nearly constant over temperature in order to hold the bias current through transistor $Q_{rf}$ steady. Voltage $V_{ref}$ is an external reference voltage independent of temperature, and as temperature rises, the voltage at point A ($V_A$) will change since $V_A$ is equal to the base-emitter voltage drop ($V_{be}$) through transistors $Q_2$, $Q_3$ (same as $Q_4$, $Q_{rf}$).

As temperature rises, $V_{be}$ is reduced and $V_A$ decreases, thus and more current flows through resistor Ra. However, as $V_{be}$ is reduced, transistor $Q_1$ bias current $I_{c1}$ increases. Since $I_{c1}$ plus $I_{ref}$ equal current flow through resistor Ra, $I_{ref}$ will be temperature independent when $I_{c1}$ drains the excess current over temperature. $I_{c1}$ is determined by bias circuitry R1, R2.

This current operation can be expressed mathematically as follows:

$$(V_{ref}-V_A)/Ra-Ic1=Iref$$

$$Ic1*(Re+(R1\|R2)/\beta)+Vbe=Vref*R2/(R1+R2)$$ where $\beta$ is the current gain of the bipolar transistor.

Since $\partial Iref/\partial T=0$ is the design target, then:

$$Ra/2=Re+(R1\|R2)/\beta$$

At this moment:

$$Iref=Vref(1-2R2/(R1+R2))/Ra=Vref*(R1-R2)/(R1+R2)/Ra \qquad (1)$$

Therefore, a minimum temperature variation of $I_{ref}$ and $I_{crf}$ is achieved.

Figure 3:
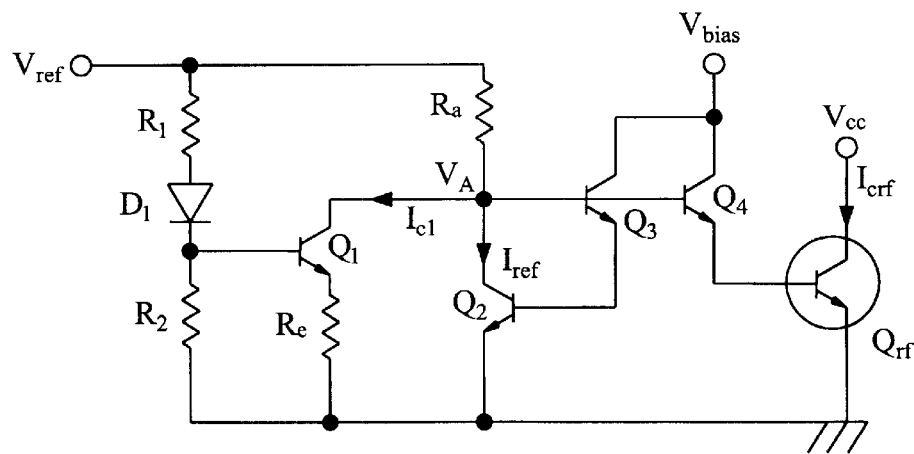
FIG. 3 is a schematic of another embodiment of a temperature compensated current mirror and low voltage bipolar power amplifier in accordance with the invention.

One possible drawback in the circuit of FIG. 2 lies in current flow through resistors R1, R2 when $V_{ref}$ is reduced below $V_{be}$ and all transistors are turned off. The circuit is turned off completely only when $V_{ref}$ is exactly 0 volt. To enhance the circuit performance, a diode D1 is provided in the serial circuit of resistors R1, R2 as illustrated in FIG. 3. Thus, as $V_{ref}$ is reduced below $V_{diode}$ and $V_{be}$ the diode and transistors are turned off and there is no connection path from $V_{ref}$ to ground.

One can further derive the condition when $\partial Iref/\partial T=0$. Since $\partial Vbe/\partial T \approx \partial Vdiode/\partial T$, and $Idiode \gg Ib1$ $$Iref=Vref/Ra-Vref*R2/(R1+R2)Re+Vbe(1/(R3-2/Ra)+Vd*R2/Re/(R1+R2)$$

$$\partial Iref/\partial T=0 \text{ when } Ra=2(R1+R2)Re/(2R2+R1)$$

and $$Iref=Vref*R1/(2*(R1+R2)*Re)=Vref*R1/((2R2+R1)*Ra) \qquad (2)$$

Another advantage of the temperature compensated current mirror by-circuit as shown in FIG. 3 is reduced sensitivity to the $V_{ref}$ as shown in both equations 1 and 2. Without the temperature compensated circuit, the $I_{ref}$ is simply $(V_{ref}-V_A)/Ra$. As $V_{ref}$ is increased, $\Delta Iref=\Delta Vref/Ra$.

But for the circuit in FIG. 2, $\Delta Iref=\Delta Vref*(R1-R2)/(R1+R2)/Ra$; and for the circuit in FIG. 3, $\Delta Iref=\Delta Vref*R1/((2R2+R1)*Ra)$.

In both circuits, the sensitivity is reduced, by $(R1-R2)/(R1+R2)$ and $R1/((2R2+R1))$ respectively. Therefore the $I_{ref}$ vs. $V_{ref}$ curve is improved in FIG. 4. Once $V_{ref}$ reaches the normal operation range, the $I_{ref}$ is relatively insensitive to the $V_{ref}$, as illustrated in the graph of FIG. 4.

In a CDMA handset power amplifier made of GaAs HBT for 3 to 3.5V operation, the circuit can maintain a near constant bias current over temperature. A power transistor for IS95 may draw a quiescent current of 50 mA at room temperature. The current from the $V_{ref}$ is about 1 to 2 mA without the temperature compensation circuit. As temperature changes from −30 to +85° C., the quiescent current will change from about 30 mA to 75 mA or more.

When the temperature compensation circuit is added, the quiescent current at room temperature is still 50 mA; but the current from $V_{ref}$ is increased to 2 to 3 mA. Over the same temperature range, the quiescent current is maintained at 50 mA or so. This offers several advantages over the non-compensated circuit. For example, at high temperature, the current drawn by the power transistor stage is still <55 mA, versus the non-compensated current of 80 mA or so. Further, at low temperature and without the temperature compensation, the quiescent current is lower than that at room temperature, and may cause ACPR to degrade at high power level (25 dBm or more).

Besides these advantages, the temperature-compensated circuit also facilitates other power amplifier amplifications in CDMA. At low power level, the power transistor can operate at even lower current, e.g. 25 mA. A simple on/off switch, $Q_{sw}$, may be used to change the power transistor bias current as shown in FIG. 5. When $Q_{sw}$ is turned on, it will be in the saturation range, and the current flowing through it is $(V_A-V_{sat, sw})R_Q$ which is nearly constant over temperature. With the temperature compensation, the bias current at low current state is flat versus temperature. If no temperature compensation is used, the low bias current at low temperature may be so small as shown in FIGS. 6A, 6B. In FIG. 6A, $I_{crf}$ varies appreciably with temperature, whereas in FIG. 6B $I_{crf}$ remains nearly constant with temperature. Again it will have a much lower power level with acceptable ACPR.

While the invention has been described with reference to specific embodiments, the description is illustrative of the invention and is not to be construed as limiting the invention. Various modifications and applications may occur to those skilled in the art without departing from the true spirit and script of the invention as defined by the appended claims.

What is claimed is:

1. In a current mirror circuit having a reference node, a temperature compensating circuit for maintaining a reference current value during temperature variations comprising
   a compensating transistor circuit including a compensating transistor between the reference node and a circuit ground and in parallel with a reference current bipolar transistor, the reference node being between a first resistor and the reference current bipolar transistor serially connected between a reference voltage and a circuit ground, and
   bias circuitry for biasing the compensating transistor whereby current flows from the reference node to ground to remove excess current from the compensating transistor when temperature increases, and a bias transistor connected between a bias voltage and a base of the reference current bipolar transistor with the reference node connected to a base of the bias transistor, whereby the voltage applied to the base of the reference current bipolar transistor is the reference node voltage less base-emitter voltage drop of the bias transistor.

2. The temperature compensating circuit as defined by claim 1 wherein the bias circuit includes a diode for limiting bias circuit current flow when the reference voltage drops below a predetermined level.

3. The temperature compensating circuit as defined by claim 2 wherein the bias circuitry comprises second and third resistors serially connected with the diode, the diode preventing bias current flow when the reference voltage drops below the diode voltage drop.

4. A low voltage bipolar transistor amplifier circuit comprising
  (a) a power bipolar transistor connected between a supply voltage and circuit ground,
  (b) a current mirror circuit including a reference current transistor serially connected with a first resistor at a reference node and between a reference voltage and circuit ground, and a pair of bipolar bias transistors connected respectively between a bias voltage and a base of the reference current transistor and between the bias voltage and a base of the power bipolar transistor, bases of the pair of bipolar bias transistors being connected to a common terminal of the reference current transistor and the first resistor, and
  (c) a temperature compensating circuit comprising a compensating transistor connected between the reference node and the circuit ground and in parallel with the reference current transistor, and bias circuitry for biasing the compensating transistor whereby current flows from the reference node to ground to remove excess current from the compensating transistor when temperature increases.

5. The low voltage bipolar transistor amplifier circuit as defined by claim 4 and further including a bipolar bias transistor connected between the bias voltage and the base of the reference current transistor with the reference node connected to the base of the bipolar bias transistor, whereby the voltage applied to the base of the reference current transistor is the reference node voltage less base-emitter voltage drop of the bipolar bias transistor.

6. The low voltage bipolar power transistor amplifier circuit as defined by claim 5 wherein the bias circuitry includes a diode for limiting bias circuit current flow when the reference voltage drops below a predetermined level.

7. The low voltage bipolar power transistor amplifier circuit as defined by claim 6 wherein the bias circuitry comprises second and third resistors serially connected with the diode, the diode preventing bias circuit current flow when the reference voltage drops below the diode voltage drop.

8. The low voltage biopolar power transistor amplifier circuit as defined by claim 7 and further including a switch circuit in parallel with the reference current transistor for switchably reducing current through the reference current transistor.

9. The low voltage bipolar power transistor amplifier circuit as defined by claim 4 and further including a switch circuit in parallel with the reference current transistor for switchably reducing current through the reference current transistor.

* * * * *